United States Patent [19]
Takizawa

[11] Patent Number: 5,568,626
[45] Date of Patent: Oct. 22, 1996

[54] METHOD AND SYSTEM FOR REWRITING DATA IN A NON-VOLATILE MEMORY A PREDETERMINED LARGE NUMBER OF TIMES

[75] Inventor: Hiroshi Takizawa, Tokyo, Japan

[73] Assignee: NEC Corporation, Tokyo, Japan

[21] Appl. No.: 193,913

[22] Filed: Feb. 3, 1994

Related U.S. Application Data

[63] Continuation of Ser. No. 661,164, Feb. 27, 1991, abandoned.

[30] Foreign Application Priority Data

Feb. 27, 1990 [JP] Japan ................................. 2-48273

[51] Int. Cl.$^6$ ................................................ G06F 12/06
[52] U.S. Cl. ................ 395/430; 395/497.04; 364/DIG. 1
[58] Field of Search ........................................... 395/430

[56] References Cited

U.S. PATENT DOCUMENTS

| | | | |
|---|---|---|---|
| 4,638,430 | 1/1987 | Perra et al. | 395/425 |
| 4,638,457 | 1/1987 | Schrenk | 365/189 |
| 4,663,770 | 5/1987 | Murray et al. | 395/775 |
| 4,718,041 | 1/1988 | Baglee et al. | 365/185 |
| 4,774,544 | 9/1988 | Tsuchiya et al. | 355/14 |
| 4,780,855 | 10/1988 | Iida et al. | 365/230 |
| 4,803,707 | 2/1989 | Cordan, Jr. | 377/24.1 |
| 4,947,410 | 8/1990 | Lippmann et al. | 377/26 |
| 5,048,085 | 9/1991 | Abraham et al. | 380/23 |

FOREIGN PATENT DOCUMENTS 283496  12/1987  Japan .

*Primary Examiner*—Reba I. Elmore
*Attorney, Agent, or Firm*—Sughrue, Mion, Zinn, Macpeak & Seas

[57] ABSTRACT

A method and system for storing data in a non-volatile memory having a plurality of memory regions each assigned with a serial address to permit serial accessing of the plurality of memory regions. Each memory region has a writing count number storing region and a data storing region. In accessing the non-volatile memory, contents of the writing count number storing regions are checked serially to locate an effective memory region having the last serial address among memory regions having the same writing count number. In writing data into the non-volatile memory, a memory region having an address following that of the located effective memory region will be accessed, and in reading data from the non-volatile memory, the located effective memory region will be accessed. The final address of the non-volatile memory is followed by the first address thereof, thus permitting circular or access to the serially addressed memory regions of the non-volatile memory.

8 Claims, 5 Drawing Sheets

METHOD AND SYSTEM FOR REWRITING DATA IN A NON-VOLATILE MEMORY A PREDETERMINED LARGE NUMBER OF TIMES

This is a continuation of application Ser. No. 07/661,164 filed Feb. 27, 1991 which is now abandoned.

FIELD OF THE INVENTION

This invention relates to a method and a system for storing data in a memory, and more particularly to, a method and a system for storing data in a memory in which data should be re-written a considerable number of times and should be maintained for a long time even in a state where the power supply is cut off.

BACKGROUND OF THE INVENTION

In a first conventional method for storing data which should be re-written a considerable number of times and should be maintained even in a state where the power supply is cut off, the data are stored in a volatile type memory such as a random access memory (RAM) which is backed up by a battery to maintain the data. The data can be re-written an unlimited number of times.

In a second conventional method for storing data which should be re-written a considerable number of times and should be maintained even in a state where the power supply is cut off, the data are stored in a non-volatile type memory such as an erasable programmable read only memory (EPROM) which maintains the data without backing up even in a state where the power supply is cut off.

According to the first and second conventional methods for storing data, however, there are disadvantages as described below.

In the first conventional method for storing data, the data can not be maintained for a long time in the state where the power supply is cut off, because the data may be volatilized if the battery is exhausted.

In the second conventional method for storing data, the number of times of re-writing is limited because of the property of the non-volatile type memory, so that there occurs a practical problem if the number of necessary times of re-writing is larger than that of possible times of re-writing of the non-volatile type memory.

SUMMARY OF THE INVENTION

Accordingly, it is an object of the invention to provide a method and a system for storing data in a memory in which data can be stored for a predetermined time in the state where the power supply is cut off even if the number of necessary times of re-writing data is larger than that of possible times of re-writing data of the non-volatile memory.

According to a first feature of the invention, a method for storing data in a memory includes the steps of providing a memory having a plurality of memory regions for storing data and count numbers of writing the data thereinto, the plurality of memory regions being accessed by serial addresses assigned thereto, a last address of the serial address being followed by a first address of the serial addresses to convert the plurality of memory regions into circularly accessible memory regions, locating an effective memory region from the circularly accessible memory regions by reference to the count numbers and the serial addresses, the effective memory region having a count number indicative of writing data thereinto at a latest time, and accessing a memory region selected from the effective memory region and a memory region having an address next to that of the effective memory region, the effective region being selected for reading data therefrom, and the next address memory region being selected for wet tiny data thereinto.

According to a second feature of the invention, a system for storing data in a memory comprises:

a memory having a plurality of memory regions for storing data and count numbers of writing the data thereinto, the plurality of memory regions being provided with serial addresses, a last address of the serial addresses being followed by a first address of the serial addresses to convert the plurality of memory regions to circularly accessible memory regions, a counter for counting a number of times of writing the data into each of the plurality of memory regions so as to provide count members, A device for locating an effective region from the circularly accessible memory regions by reference to the count numbers and the serial address, the effective memory region having a count number indicative of writing data thereinto at a latest time, a device for writing data into a memory region having an address next to that of the effective memory region, and a device for reading data from the effective memory region.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
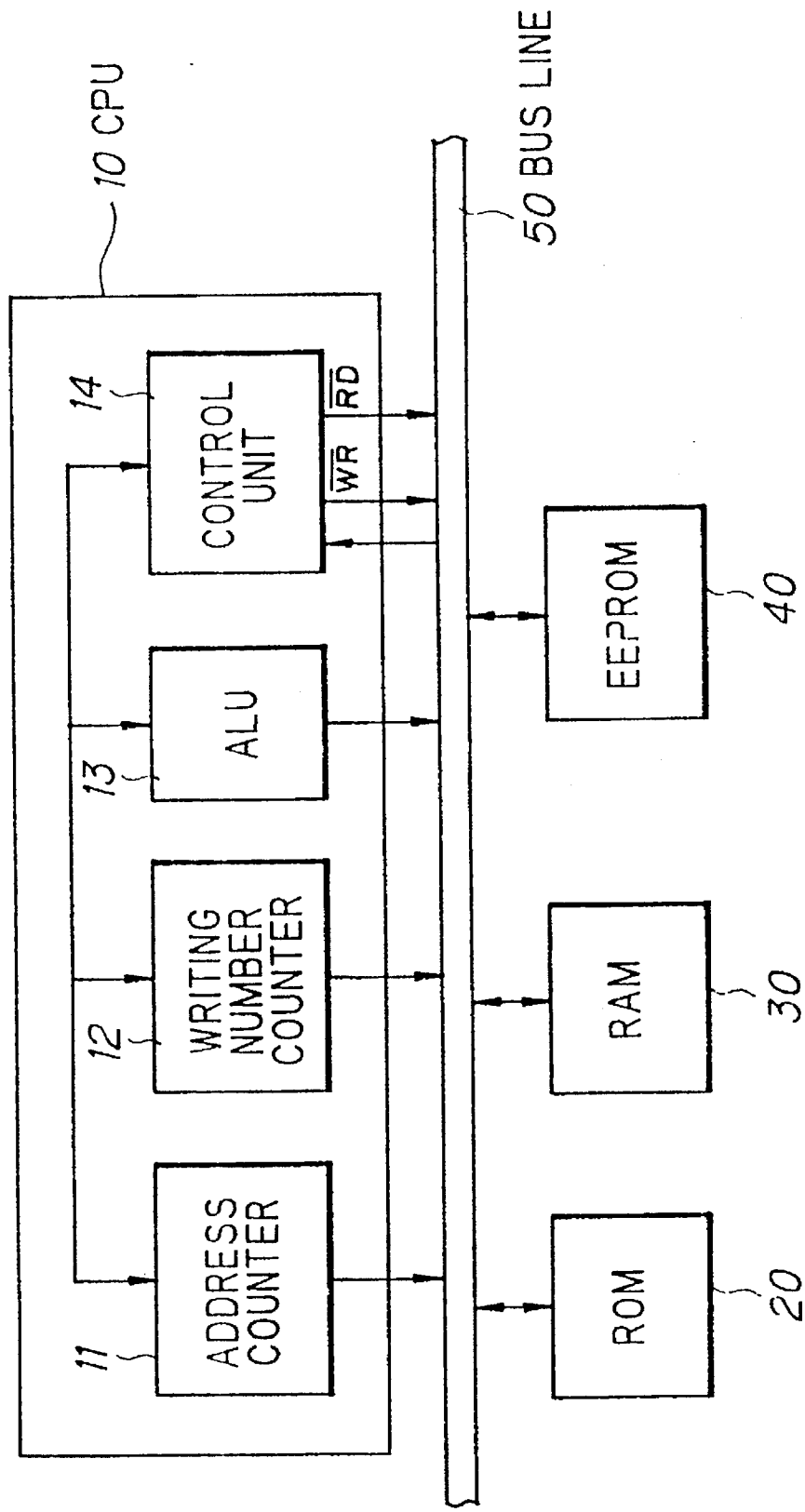
FIG. 1 is a block diagram showing a system for storing data in a preferred embodiment according to the invention.

FIG. 1 is a block diagram showing a system for storing data in a preferred embodiment according to the invention. The system for storing data comprises a central processor unit (CPU) 10, a read only memory (ROM) 20, a random access memory (RAM) 30, and an electrically erasable programmable ROM (EEPROM) 40. These components are connected to each other by a bus line 50.

The CPU 10 comprises an address counter 11, a writing number counter 12, an arithmetic and logic unit (ALU) 13, and a control unit 14. The address counter 11 counts an address of a memory region in the EEPROM 40. The writing number counter 12 counts the number of times of writing data The ALU 13 carries out various arithmetic processes The control unit 14 controls reading and writing operations, and locates an effective address of a memory region in the EEPROM.

The ROM 20 stores programs by which the control of the CPU 10 is carried out. The RAM 30 stares data temporarily. The EEPROM 40, into which data can be written a limited number of times, stores data which should be re-written a considerable number of times and should be maintained even in a state where the power supply is cut off.

Figure 2:
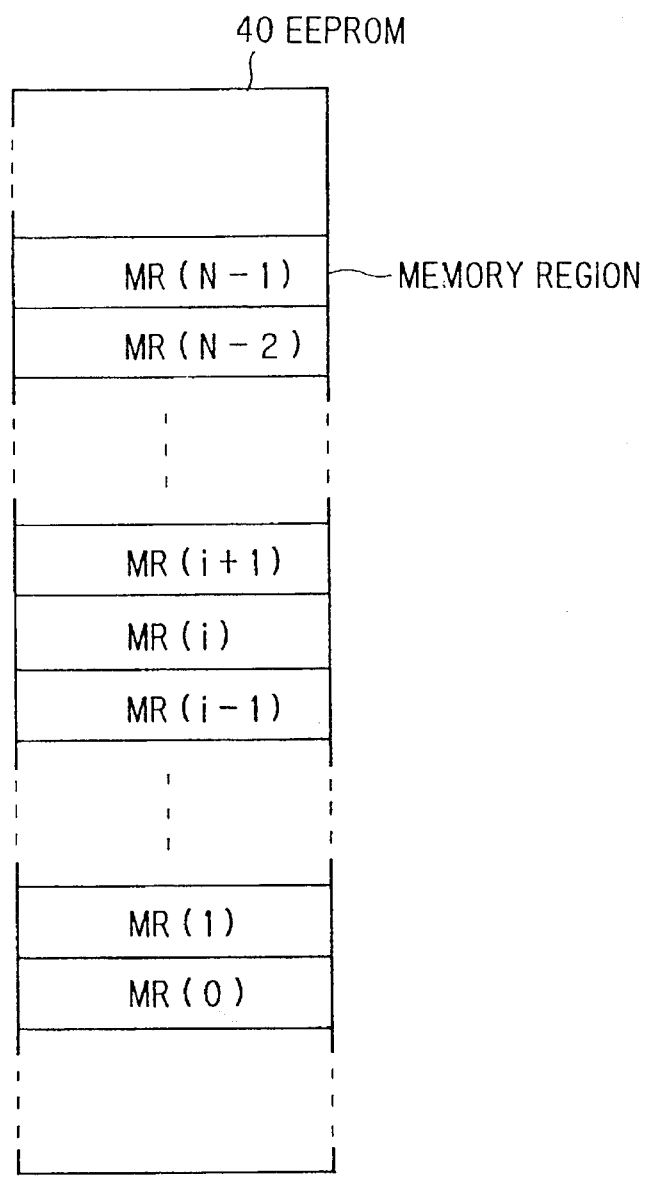
FIG. 2 is a memory map of the EEPROM of the system for storing data in the preferred embodiment according to the invention.

The EEPROM 40 has a plural number N of memory regions M(0), MR(1), MR(N-1) which have serial addresses 0, 1, ..., N-1. FIG. 2 is a memory map of the EEPROM of the system for storing data in FIG. 1. The number N of the memory regions MR(0), MR(1), ..., MR(N-1) has a value as following.

$N \geq N_1/N_z$

Here, Nis defined as the number of necessary times of writing data, and $N_z$ is defined as the number of maximum possible times of writing data to the EEPROM 40.

Figure 3:
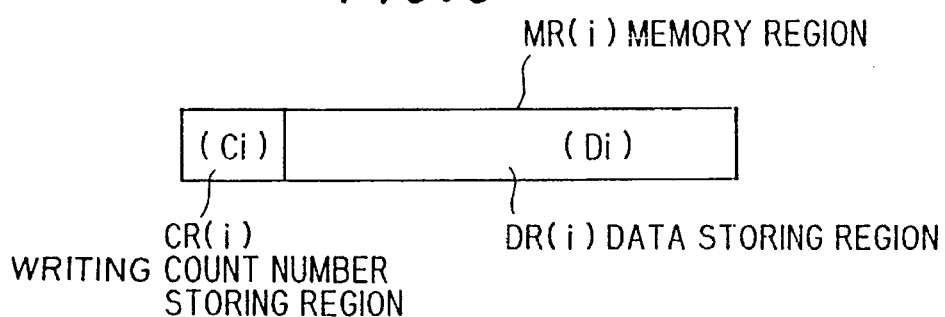
FIG. 3 is an explanatory view showing a content of one memory region of the EFPROM of the system for storing data in the preferred embodiment according to the invention.

FIG. 3 is an explanatory view showing a content of one memory region MR(i) of the EEPROM 40, where i is an integer between 0 to N-1. The memory region MR(i) has a writing count number storing region CR(i) having a predetermined number of bits for storing a writing count number $C_i$ of the writing number counter 12 and a data storing region DR(i) for storing data $D_i$.

In operation, all contents of the writing count number storing regions of the memory regions are checked to locate an effective memory region which has the last address in a group of the memory regions each of which stores a writing count number equal to that stored in a first memory region which has the first address in the group of the memory regions.

In the writing operation, a count number and data are written into the writing count number storing region and the data storing region of a memory region which has an address next to that of the effective memory region. The writing count number has a value which is the result of adding one to the writing count number stored in the writing count number storing region of the first memory region if the effective memory region is a last memory region which has the last address in the memory regions, and a value which is the same as that stored in the writing count number storing region of the first memory region if the effective memory region is not the last memory region.

In the reading operation, the writing count number and the data are read out from the effective memory region if the effective memory region exists.

Figure 4:
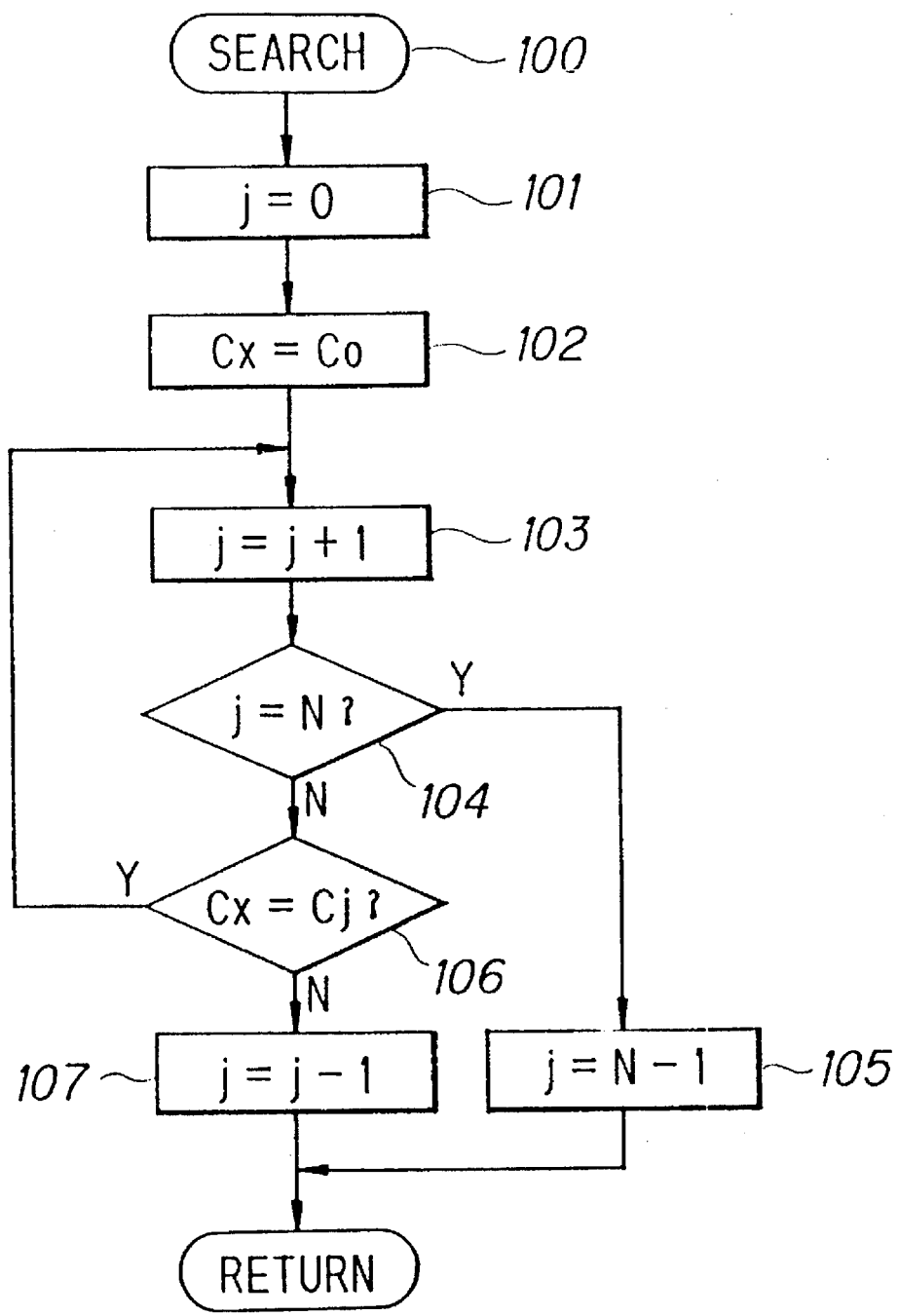
FIG. 4 is a flow chart showing operation of locating an address of an effective memory region in the memory regions of the EEPROM in the system for storing data in the preferred embodiment according to the invention.

FIG. 4 is a flow chart showing operation of searching the memory regions MR(0), MR(1) ..., MR(N-1) for locating an address of an effective memory region. This searching operation is carried out as a subroutine.

In operation, a content of a number j is set to "0" in a step 101, and a content of a writing count number counter $C_x$ is set to be equal to the writing count number $C_O$ of the first memory region MR(0) in a step 102. Then, j is added by one in a step 103, and it is judged whether j is equal to N in a step 104. If it is, then j is set to be N-1 which is the final address in the memory regions in a step 105, and then the operation is returned to the main operation. If it is not, then it is judged if $C_x$ is equal to $C_j$ in so step 106. If it is so, then the operation is re-started from step 103. If it is not, then j is subtracted by one to get an address of the effective memory region in step 107. As a result, the address of the effective memory region is found out as the number j.

Figure 5:
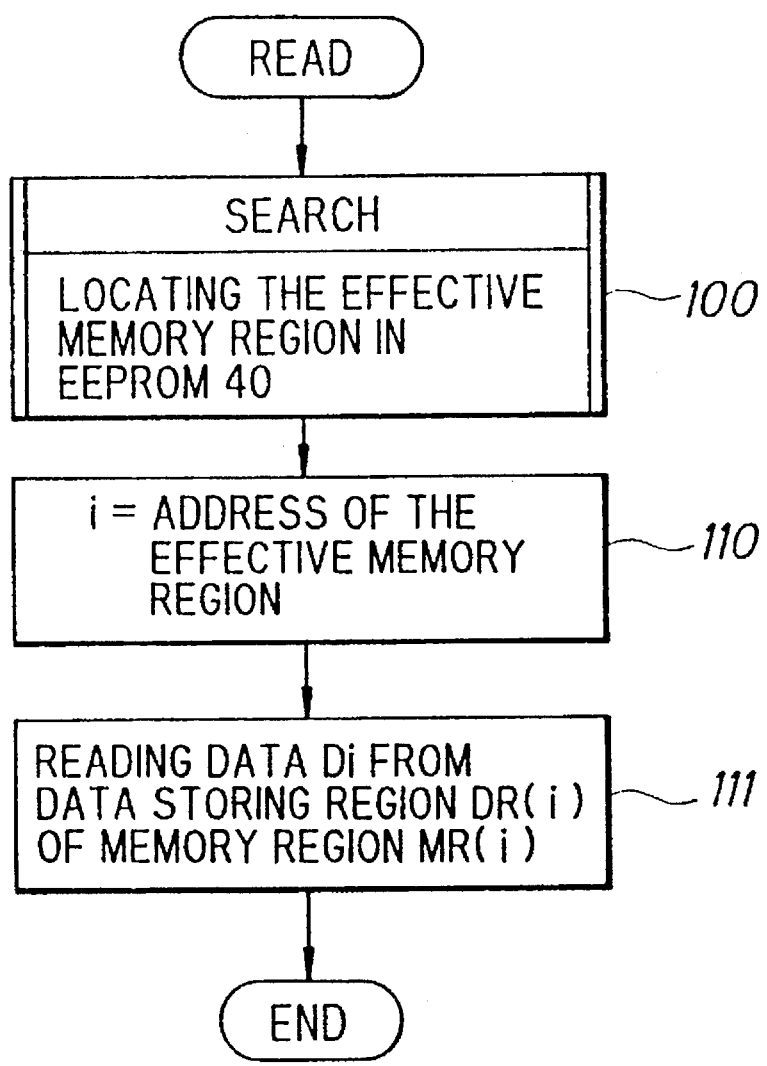
FIG. 5 is a flow chart showing operation of reading out data from a memory region of the EEPROM in the system for storing data in the preferred embodiment according to the invention.

FIG. 5 a is a flow chart showing operation of reading out data from the effective memory region in the EEPROM.

In operation, first, the searching subroutine 100 shown in FIG. 4 is carried out to locate an address of the effective memory region. Then, i is set to be the address of the effective memory region located in the subroutine 100 in step 110. After that, the data $D_i$ is read out from a data storing region DR(i) of the effective memory region MR(i) in step 111.

Figure 6:
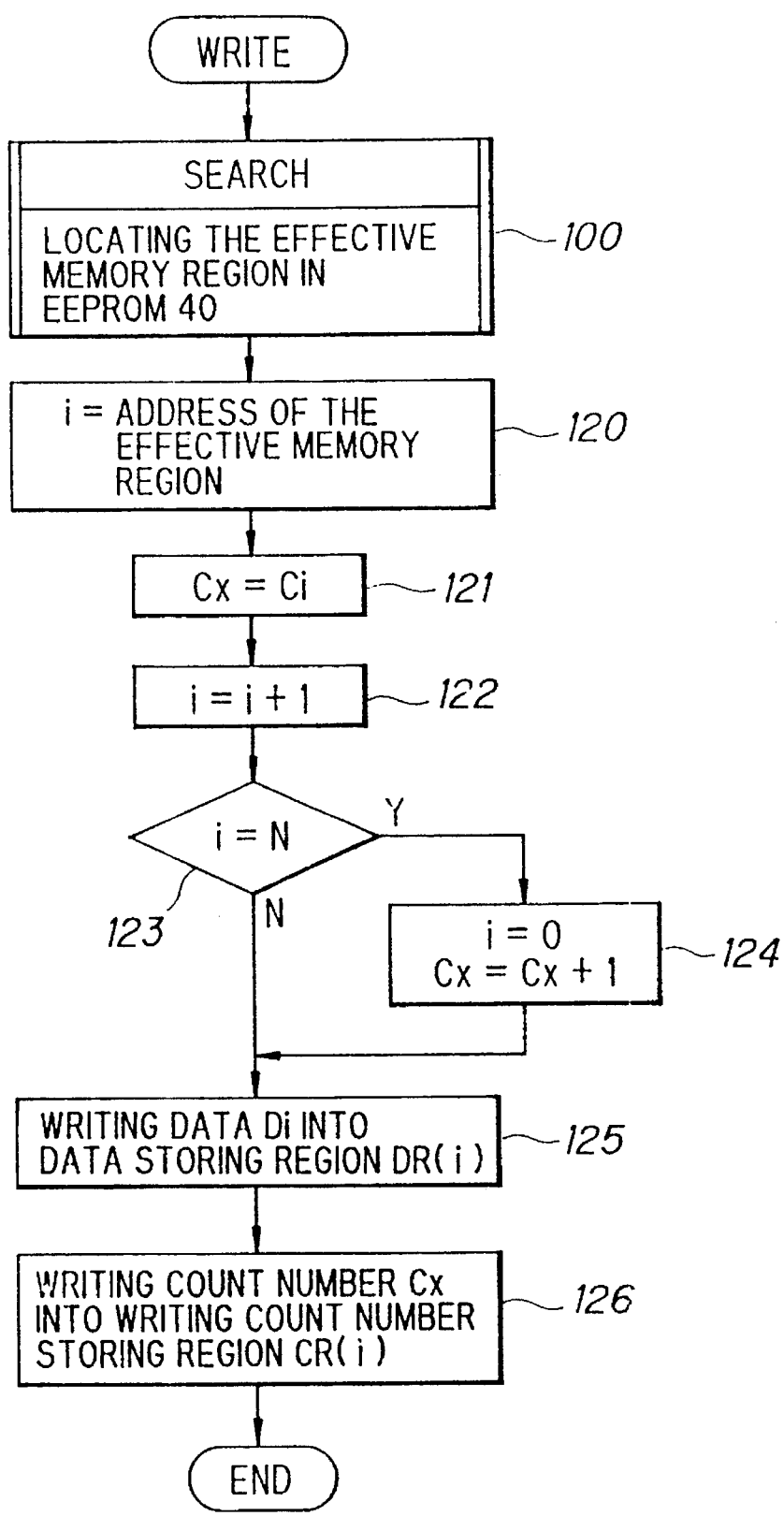
FIG. 6 is a flow chart showing operation of writing data into a memory region of the EEPROM in the system for storing data in the preferred embodiment according to the invention.

FIG. 6 is a flow chart showing the operation of writing data into a memory region having an address next to that of the effective memory region in the EEPROM.

In operation, first, the searching subroutine 100 is carried out to find an address of the effective memory region. Then, i is set to be the address of the effective memory region located in the subroutine 100 in step 120. Then, $C_x$ is set to be equal to $C_i$ in step 121, and then i is added by one in step 122. Then, it is judged whether i is equal to N in step 123. If it is, then i is set to be "0" and $C_x$ is added by one in step 124, and then data $D_i$ which is $D_0$ is written into a data storing region DR(i) which is DR(0) of the memory region MR(i) which is MR(0) in step 125. If it is not, then the step 125 is carried out directly without changing i and $C_x$. In this case, data $D_i$ is written into a data storing region DR(i) of the memory region MR(i) which has the next address to that of the effective memory region. After step 125, the writing count number counter $C_x$ is written into a writing count number storing region CR(i). The memory region MR(i) to which the writing count number $C_i$ and the data $D_i$ are newly written is defined as a new effective memory region.

Next, a practical example of selecting a memory region from a group of memory regions will be described. Here, it is supposed that the contents of the writing count number storing regions are defined as $C_k$ (k=0, 1, ..., N-1), and the writing count number $C_k$ consists of 8-bits, however, a 2-bit number or 3-bit number is generally sufficient as the writing count number. The following table shows examples of contents of $C_0, C_1, ..., C_{N-1}$ by describing in hexadecinormal digits.

|  | STATE-1 | STATE-2 | STATE-3 | STATE-4 | STATE-5 | STATE-6 | STATE-7 |
| --- | --- | --- | --- | --- | --- | --- | --- |
| $C_{N-1}$ | FF | FF | 02 | 02 | 02 | 03 | 03 |
| $C_{N-2}$ | FF | FF | 02 | 02 | 02 | 03 | 03 |
| . | . | . | . | . | . | . | . |
| . | . | . | . | . | . | . | . |
| $C_{k+3}$ | FF | FF | 02 | 02 | 02 | 03 | 03 |
| $C_{k+2}$ | FF | FF | 02 | 02 | <u>03</u> | 03 | 03 |

-continued

|  | STATE-1 | STATE-2 | STATE-3 | STATE-4 | STATE-5 | STATE-6 | STATE-7 |
|---|---|---|---|---|---|---|---|
| $C_{k+1}$ | FF | FF | 02 | <u>03</u> | 03 | 03 | 03 |
| $C_k$ | FF | FF | <u>03</u> | 03 | 03 | 03 | 03 |
| $C_{k-1}$ | FF | FF | 03 | 03 | 03 | 03 | 03 |
| . | . | . | . | . | . | . | . |
| . | . | . | . | . | . | . | . |
| $C_1$ | FF | FF | 03 | 03 | 03 | 03 | 03 |
| $C_0$ | FF | <u>00</u> | 03 | 03 | 03 | 03 | <u>04</u> |

Generally, eight bits of writing count number storing regions in the EEPROM 40 are "11111111" in an initial state. Therefore, ($C_o$, $C_1$, . . . , $C_{N-1}$ are all described as "FF" in hexadecinormal digits shown as the STATE 1 in the Table. When the first writing operation is carried out, the memory region MR(0) is selected. For this purpose, the content of the writing count number $C_0$ is changed to "00" ("00000000") as shown in the STATE 2 in the Table. At the same time, the data $D_0$ is written into the data storing region DR (0) of the memory region MR (0).

In the STATE 3, contents of $C_O$ to $C_k$ are "03" ("00000011") and contents of $C_{k+1}$, to $C_{N-1}$, are "02" ("00000010"), so that an effective memory region is MR(k), because the content of the writing count number $C_K$ is the same as that of the writing count number $C_0$ and has the last address in the writing count numbers which have the same contents as that of the Writing count number $C_0$. If the writing operation is carried out, the contents of the writing count numbers changes to the STATE 4, and then the STATE 5. If the writing count number "03" is written into the writing count number storing region of the memory region MR(N–1) as shown in the STATE 6, then the writing count number $C_0$ is added to be "04" by one as shown in the STATE 7.

As shown in the Table, the memory region MR(0), MR(k), MR(k+1) MR(k+2) and MR(0) are effective, memory regions, respectively, in the STATES 2, 3, 4, 5 and 7 as indicated by underlined writing count numbers. Thus, data are read from the effective memory regions, while data are written into memory regions having addresses next to those of the effective memory regions. In the above table, data can be re-written into each memory region a predetermined number of times equal to or less than 126 (FF) times depending on a re writing property of EEPROM.

Although the invention has been described with respect to specific embodiment for complete and clear disclosure, the appended claims are not limited to this embodiment and alternative constructions may occur to one skilled in the art which fairly fall within the basic teaching herein set forth.

What is claimed is:

1. A method for storing data in a non-volatile memory, comprising the steps of:

writing data into a plurality of memory regions of said non-volatile memory to which data is able to be written a limited number of times, said plurality of memory regions including an initial memory region and a final memory region, each of the memory regions being assigned a serial address, the initial memory region being assigned the first address among the serial addresses, the final memory region the last address among said serial addresses, and the final address being followed by the initial address to permit circular access of said non-volatile memory, said plurality of memory regions being equal or greater in number than a value determined by dividing the number of times data is to be written into said non-volatile memory by said limited number of times, and each of said plurality of memory regions having a writing count number storing region for storing a writing count number and a data storing region for storing data;

searching said plurality of memory regions to locate an effective memory region defined as that memory region which has the last serial address among a group of said memory regions storing a writing count number equal to that stored in said initial memory region;

writing a writing count number and data into a writing count number storing region and a data storing region, respectively, of a memory region which has an address next following that of amid effective memory region, said writing being performed without erasing data from said effective memory region, said writing count number having a value which is one greater than said writing count number stored in said initial memory region if said effective memory region is said final memory region, and writing a writing count number which is the same as that stored in said writing count number storing region of said initial memory region if said effective memory region is not said final memory region; and reading data from said effective memory region.

2. A method for storing data in a non-volatile memory according to claim 1,
   wherein said non-volatile memory is an EEPROM.

3. A system for storing data in a non-volatile memory, said system comprising:

memory means having a plurality of memory regions for storing data and count numbers, each count number being indicative of the number of times data has been written into said memory regions, said plurality of memory regions each being provided with a serial address, a last address of said serial addresses being followed by a first address of said serial addresses so that said plurality of memory regions are circularly accessible;

counter means for providing said count numbers;

means for locating an effective region from said plurality of memory regions by reference to said count numbers and said serial addresses, said effective memory region being the memory region having the last serial address among a group of memory regions of said plurality of memory regions having the same count number, which same count number is the largest count number associated with said plurality of memory regions;

means for writing data into a memory region having an address next following that of said effective memory region without erasing data stored in said effective memory region; and means for reading data from said effective memory region.

4. A system for storing data in a non-volatile memory, according to claim 3, wherein:

said plurality of memory regions satisfy an equation $N \geq N_1/N_2$, where N is the number of said plurality of memory regions, $N_1$ is a number of times data is to be written thereinto, and $N_2$ is a number of times data can be written thereinto as determined by a re-writing property of said non-volatile memory.

5. A system for storing data in a non-volatile memory, said system comprising:

a non-volatile type memory to which data can be written a limited number of times, said non-volatile type memory having a plurality of memory regions including an initial memory region and a final memory region, said plurality of memory regions each being identified by a serial address, the initial memory region being assigned a first address among the serial addresses, the final memory region the last address among said serial addresses, and the final address being followed by the initial address to permit circular access of said non-volatile memory, the number of memory regions being equal to or greater than a value obtained by dividing the number or times of writing data into said non-volatile memory by said limited number of times, each of said plurality of memory regions having a writing count number storing region for storing a writing count number and having a data storing region for storing data;

means for searching said plurality of memory regions to locate an effective memory region defined as that memory region which has the last serial address among a group of said memory regions storing a writing count number equal to that stored in said initial memory region;

means for writing a writing count number and data into a writing count number storing region and a data storing region, respectively, of a memory region which has an address next following that of said effective memory region, said writing being performed without erasing data stored in said effective memory region, said writing count number being one greater than said writing count number stored in said initial memory region if said effective memory region is said final memory region, and a writing count number which is the same as that stored in said writing count number storing region of said initial memory region if said effective memory region is not said final memory region; and means for reading data from said effective memory region.

6. A system for storing data in a non-volatile memory, according to claim 5, wherein said non-volatile memory is an EEPROM.

7. A method for storing data in a non-volatile memory, comprising the steps of:

writing data into a plurality of memory regions of said non-volatile memory together with a count number, said count number being indicative of a number of times data is written into each memory region of said plurality of memory regions, each of said plurality of memory regions being assigned a serial address, a final address of said non-volatile memory being followed by an initial address thereof to permit circular access to said non-volatile memory;

searching the count numbers stored in said plurality of memory regions to locate an effective memory region storing effective data, said effective memory region being defined as that memory region having the last serial address among a group of memory regions of said non-volatile memory storing the same writing count number, which same writing count number is larger than that of the remaining memory regions; and accessing said non-volatile memory in accordance with the location of said effective memory region, and in a case where said accessing is for data writing, writing data in a memory region having an address next following that of said effective memory region, without erasing data stored in said effective memory region, and in a case where said accessing is for data reading, reading data from said effective memory region.

8. A method for storing data in a non-volatile memory, according to claim 7, wherein:

said plurality of memory regions satisfy an equation $N \geq N_1/N_2$, where N is the number of said plurality of memory regions, $N_1$ is a number of times data are written thereinto, and $N_2$ is a number of times data can be written thereinto as determined by a re-writing property of said non-volatile memory.

* * * * *